United States Patent [19]

Mattor

[11] 3,847,614

[45] Nov. 12, 1974

[54] DIAZO PHOTOPOLYMER COMPOSITION AND ARTICLE COMPRISING CARBOXYLATED RESIN

[75] Inventor: John A. Mattor, Bar Mills, Maine

[73] Assignee: Scott Paper Company, Delaware County, Pa.

[22] Filed: Mar. 14, 1973

[21] Appl. No.: 341,272

Related U.S. Application Data

[63] Continuation-in-part of Ser. No. 180,200, Sept. 13, 1971.

[52] U.S. Cl. .......................... 96/75, 96/33, 96/91 R, 96/115 R

[51] Int. Cl. .......................... G03f 7/08, G03c 1/60

[58] Field of Search .......... 96/75, 91 R, 91 D, 91 N, 96/33, 115 R, 35.1, 36, 36.3; 260/142, 141

[56] References Cited

UNITED STATES PATENTS

| | | | |
|---|---|---|---|
| 3,653,902 | 4/1972 | Notley et al. | 96/75 X |
| 3,396,019 | 8/1968 | Uhlig | 96/75 X |
| 3,235,382 | 2/1966 | Neugebauer et al. | 96/33 |
| 3,679,419 | 7/1972 | Gillich | 96/75 X |
| 2,612,494 | 9/1952 | Von Glahn et al. | 260/142 X |
| 3,236,647 | 2/1966 | Phlipot | 96/35.1 X |
| 3,544,317 | 12/1970 | Yonczawa | 96/33 |
| 2,739,889 | 3/1956 | Neugebauer et al. | 96/75 X |
| 2,809,189 | 10/1957 | Stanley et al. | 260/141 |
| 2,612,495 | 9/1952 | Von Glahn et al. | 260/142 |
| 2,090,450 | 8/1937 | Kogel | 96/48 |
| 2,649,373 | 8/1953 | Neugebauer et al. | 96/75 X |
| 3,219,447 | 11/1965 | Neugebauer et al. | 96/33 |
| 2,937,085 | 12/1939 | Meigs et al. | 96/93 X |
| 2,405,523 | 8/1946 | Sease et al. | 96/91 R X |
| 2,522,771 | 9/1950 | Barnes et al. | 96/91 R X |
| 2,787,546 | 4/1957 | Smith et al. | 96/115 R X |
| 2,822,272 | 2/1958 | Kosalek et al. | 96/91 R |
| 3,128,181 | 4/1964 | Doggett | 96/91 R |

FOREIGN PATENTS OR APPLICATIONS

| | | | |
|---|---|---|---|
| 39-4273 | 4/1964 | Japan | 96/91 |

OTHER PUBLICATIONS

Rauner et al., Def. Publ. Search Copy of Ser. No. 14,650, filed 2/2/1970, published in 8760G816 on July 28, 1970, Def. Publ. No. T876,010,96-75X.

Dinaburg, M., "Photosensitive Diazo Compounds," The Focal Press, 1964, p. 161-170.

"Abstracts of P.S. & E. Lit.," Vol. X, 11/1971, Abstract No. 6119-71 P., Teuscher, W. Ger. Pat. No. 2,024,244, 11/26/70, p. 48-50 cited.

*Primary Examiner*—Charles L. Bowers, Jr.
*Attorney, Agent, or Firm*—John A. Weygandt; John W. Kane, Jr.

[57] ABSTRACT

Photosensitive compositions comprising a carboxylated cyclic acetal of poly (vinyl alcohol) and a lithographic diazo compound.

15 Claims, No Drawings

DIAZO PHOTOPOLYMER COMPOSITION AND ARTICLE COMPRISING CARBOXYLATED RESIN

RELATED APPLICATIONS

This application is a continuation-in-part of Ser. No. 180,200, filed Sept. 13, 1971 now abandoned.

BACKGROUND OF THE INVENTION

1. Field of the Invention

This invention relates to photo polymer compositions, more particularly to a photopolymer composition comprising a carboxylated resinous binder and a lithographic diazo compound, and to lithographic printing plates employing the same.

2. Description of the Prior Art

A lithographic diazo which is rendered insoluble by exposure to light passing through the transparent areas of an original or master transparency is referred to as "negative-working." Those areas struck by light are ink-receptive and form the areas from which the image is printed. In the unexposed portions of the plate, the soluble diazo is removed by the application of a "developing" solution, which contains a suitable solvent for the diazo, thereby exposing water-receptive areas which form the background for the image on the plate. The printing plate image thus produced is the inverse of that on the original, hence the term "negative-working."

In the use of negative-working lithographic plates referred to in the art as "subtractive" plates, the still-soluble or unhardened background areas are wiped away or "subtracted," leaving hardened, ink-receptive material in the image areas. The operation of the subtractive plate is based upon the ability to apply a thick enough layer of photosensitive material to provide an image area of satisfactory run length. Thus, in general, the thicker the layer, the greater the run length. In an older type of plate, referred to as an "additive" plate, after exposure and development of a relatively thin photosensitive layer such as a diazo layer, the image areas were rendered more durable through the addition of an abrasion-resistant coating to the image areas. The application of this coating is usually accomplished by rubbing onto the surface of the plate a liquid containing an organophilic material which is adherent to the diazo remaining in the light exposed areas. Such a liquid is referred to in the art as an "image developer."

Subtractive plates have several advantages over the additive type. While even skilled platemakers have difficulty achieving consistent results with an image developer, development of subtractive plates involves merely wiping away the unhardened background. The simplicity of this step obviously lends itself well to automated processing. Furthermore, inclusion of a pigment in the lithographic coating, provides a visible image upon development, which is very helpful to the platemaker.

Workers in the lithographic art have been seeking a resinous binder for lithographic diazo compounds which would provide a strong and durable image for a subtractive lithographic printing plate. The approach of incorporating a resinous binder with the photosensitive compound has been hitherto regarded as unsuccessful. See U.S. Pat. No. 3,136,637 at column 2, lines 3 through 21 which reports that such plates are difficult to manufacture because of solubility problems and that the press life of such plates is little, if any, greater, than conventional plates. Even recent developments utilizing this approach have recommended the application of a coating to the developed image to achieve a large number of copies. See U.S. Pat. No. 3,544,317, column 4.

SUMMARY OF THE INVENTION

Accordingly, it is an object of the present invention to provide a new resinous binder which, when combined with a lithographic diazo compound, forms a photopolymer composition.

A further object of this invention is to provide a new photopolymer for use in lithographic printing plates.

Another object of this invention is to provide an improved photolithographic printing plate having greater run length.

The present invention has found that cyclic acetals of poly (vinyl alcohol) with the general formula

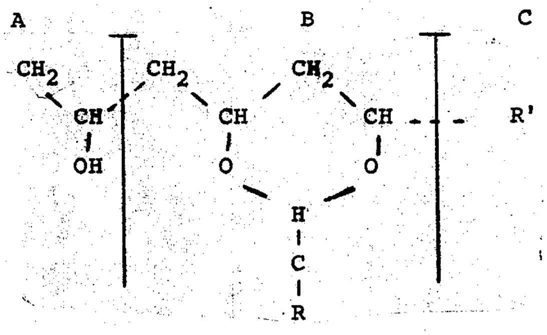

where R is predominately an aromatic moiety and R' consists of a carboxyl-containing copolymerizable moiety, the polymer chain consists of 17 to 65 mole percent of the group labelled A, up to 16 mole percent of the group labelled C, and the remainder being the group labelled B, in combination with solvent-soluble, negative-working diazo compounds provide a photopolymer which exhibits outstanding adherence to surfaces if material such as those normally employed as substrates for lithographic printing plates. This photopolymer, when utilized in a photolithographic printing plate, provides a plate of exceptional press life. The expression "predominantly," as used herein, means that more than half of the cycle acetal groups contain an aromatic moiety.

Still further it has been found, when the cyclic acetal is derived from a halogenated or nitrated benzaldehyde, the resin exhibits even greater hardness. This attribute is optimized when the benzaldehyde is 4-chlorobenzaldehyde.

When a carboxylated cyclic acetal of the above general formula is combined with the reaction product of an anionic surfactant and water-soluble, light-sensitive polyfunctional diazonium salts, said reaction product being more fully-described in copending Pat. application, Ser. No. 138,336 now Pat. No. 3,790,556, a photopolymer results which is extremely hard and tough and, when utilized in a lithographic printing plate, provides a plate of outstanding press life.

In the copending application it is disclosed that the condensation product of a diphenylamine-4-diazonium salt with formaldehyde can be reacted in an aqueous medium with certain anionic surfactants and that the reaction product thus formed, which is water-insoluble, readily precipitates out of the reaction medium. Preferred light-sensitive compounds are the condensation products of para-diazo-diphenylamine and formaldehyde (1) formed from a sulfuric acid medium and stabilized with zinc chloride, commercially available from Kalle Aktiengesellschaft of WiesbadenBiebrich, West Germany, under the designation MN30 and (2) formed from a phosphoric acid medium, sold by Kalle Aktiengesellschaft under the designation MN59.

The largest group of anionic surfactants is the group of alkyl sulfates having the general formula $ROSO_3H$. The compounds usually commercially available are the "alcohol sulfates," made by sulfating alcohols and neutralizing with caustic or amines. Most are sold as the sodium salt, $ROSO_3Na$, formed by neutralization with sodium hydroxide. Satisfactory results have been obtained with the reaction product formed from the following mono-alkyl sulfates: n-butyl, amyl, hexyl, cyclohexyl, octyl, lauryl, oleyl, and stearyl. Many alkyl sulfate surfactants are available commercially. They can be prepared by the following simple laboratory procedure. To the alcohol dissolved in methylene chloride is added an equimolar amount of chloro-sulfonic acid diluted with methylene chloride. After the evolution of hydrogen chloride, the solvent is evaporated, leaving the sulfate as a residue which will vary from an oil in the case of n-butyl, to a waxy solid in the case of stearyl.

In addition to the so-called alcohol sulfates, there exists a variety of sulfates with more complex aliphatic or aromatic components which have been found operable in the present invention. Examples include ammonium lauryl ether sulfate, (sold commercially as Sipon EA by Alcolac Chemical Company), an alkylaryl sulfate, para-nonylphenol sulfate, and two aryl-substituted aliphatic sulfates, 2-phenyl ethylsulfate and sodium isooctyl phenoxy diethoxyethyl sulfate (sold commercially as Triton 770 by Rohm and Haas Chemical Company).

Another group of surfactants is characterized as aliphatic sulfonates having the general formula $RSO_3H$ where R is a hydrocarbon, not necessarily a straight-chain hydrocarbon. Examples include sodium dioctyl sulfosuccinate, $C_{20}H_{37}O_4SO_3Na$, and lauryl sulfonate, $C_{12}H_{25}SO_3H$. A further type of aliphatic sulfonate comprises arylalkyl sulfonates, which may be characterized as $ArRSO_3H$, the sulfonic acid group being directly attached to an aliphatic group. While such surfactants are not commercially available, they can be prepared by oxidizing a compounnd of the general formula ArRSH. By way of example, 3-phenyl-1-propanethiol can be oxidized in nitric acid.

Yet another group of operable surfactants includes alkylaryl sulfonates, which may be characterized as $RArSO_3H$, the sulfonic acid group being directly attached to an aromatic ring. Examples include tertiary butylbenzene sulfonate, para-cyclohexyl benzene sulfonate, dodecyl benzene sulfonate, stearyl benzene sulfonate, and isopropyl naphthalene sulfonate.

In the case of the aliphatic (including arylalkyl) sulfate and sulfonate surfactants, if the total carbon chain has less than four members, only a small amount of reaction product is obtained and it is difficult to recover from the aqueous medium. The reaction product is not considered water insoluble unless this minimum chain length is provided. In the case of the alkylaryl sulfates and sulfonates, where the aryl moiety is phenyl, the carbon chain attached to the phenyl group must have four members in order to provide a compound which may be regarded as an anionic surfactant for the purpose of the present invention. In the case of alkylaryl sulfates and sulfonates where the aryl moiety is naphthyl, an aliphatic chain length of three suffices.

Accordingly, the surfactant is defined in copending application Ser. No. 138,336 by the following general expression:

$$X - \overset{\overset{\displaystyle O}{\|}}{\underset{\underset{\displaystyle O}{\|}}{S}} - OH$$

where X is R or RO and R is alkyl of more than three carbon atoms, alkyl of more than three carbon atoms interrupted by one or more oxyalkylene groups, or alkyl of more than three carbon atoms substituted by phenyl, naphthyl, alkylphenyl, alkylnaphthyl, or alkylphenyl or alkyinaphth interrupteed by one or more oxyalkylene groups, or X is RAr or RArO wherein Ar is phenyl or naphthyl and when Ar is phenyl R is an alkyl of more than three carbon atoms or cycloalkyl and when Ar is naphthyl R is alkyl of more than two carbon atoms or cycloalkyl.

It is largely immaterial whether free acids or salts of any of these surfactants are employed in producing the new diazos.

Preparation of the Carboxylated Resin

The carboxylated (vinyl benzal) resins of the present invention, namely the above-defined cyclic acetals, are prepared by hydrolyzing a copolymer of a vinyl ester and an unsaturated carboxylic acid followed by acetalation of the resulting alcohol with an aldehyde. The copolymers of vinyl esters are prepared by polymerizing a vinyl ester such as vinyl acetate with unsaturated carboxylic acids such as acrylic, crotonic, methacrylic, itaconic or maleic acid. The condensation of the hydrolyzed carboxylated poly (vinyl acetate), or carboxy poly (vinyl alcohol), with the aldehyde is carried out in a suitable solvent in the presence of a small amount of a mineral acid such as sulfuric acid as the catalyst. The resulting acetalation product is then neutralized, isolated, washed and dried using standard procedures which are described in greater detail hereinafter. A highly preferred resin results from the condensation of a carboxylated poly (vinyl alcohol) and 4-chlorobenzaldehyde, with about 20 to 24 percent by weight of the hydroxyls remaining unsubstituted, the hydroxyls being calculated as poly (vinyl alcohol).

As will be readily understood by one familiar with this art, traces of the vinyl ester function may be found in the form of poly (vinyl acetate) in the precipitated product. The presence of the residual ester function is of so little consequence that, if the teachingss of the present invention are followed, it can be ignored. For the purpose of this disclosure, the material is regarded as fully hydrolyzed.

Composition of Preferred Polymer after Acetal Formation

At 20% Residual Hydroxyl Content

| Group | A | B | C |
|---|---|---|---|
| Weight % | 20.0 | 74.8 | 5.2 |
| Mole % | 52.2 | 40.8 | 7.0 |

-Continued

At 24% Redisual Hydroxyl Content

| G group | A | B | C |
|---|---|---|---|
| Weight % | 24.0 | 70.5 | 5.5 |
| Mole % | 57.7 | 35.5 | 6.9 |

The above conversion from weight percent to mole percent is derived as follows: The starting material is 5 percent by weight crotonic acid and 95 percent by weight vinyl acetate. Since, coincidentally, both crotonic acid and vinyl acetate have the same molecular weight, the mole percentages are identical. Therefore, the fully hydrolyzed carboxy poly (vinyl alcohol) is also 5 mole percent crotonic acid and 95 mole percent vinyl alcohol. The molecular weight of the crotonic acid moiety is 86 and of the vinyl alcohol is 44. Thus the weight percent of the former group is $$[5 \times 86/(95 \times 44) + (5 \times 86)] \times 100 = 9.3 \text{ percent}$$

and of the latter is $$[95 \times 44/(95 \times 44) + (5 \times 86)] \times 100 = 90.7 \text{ percent}$$

(8.05 moles of A/15.42 total moles) × 100 = 52.2 mole percent of A and so forth for B and C.

The conversion for the case where the condensation product is 24 percent by weight of the group labelled A, i.e., 24 percent of the hydroxyls remaining unsubstituted, is derived in the same manner as above.

Two basic ways of preparing a poly (vinyl acetal) resin are (1) to react a suspension of fine-particle poly (vinyl alcohol) in an organic solution and (2) to react an aldehyde with an aqueous solution of poly (vinyl alcohol), resulting in a precipitate of the resin. In the second method, the precipitation may be retarded or suppressed completely by adding a solvent along with the aldehyde, such as 2-methoxyethanol or methanol, thus improving the degree of substitution attained. This is illustrated in the following two-step reaction in which a carboxy poly(vinyl alcohol) is prepared from a crotonic acidvinyl acetate copolymer, followed by acetal formation of the carboxy poly(vinyl alcohol).

Step 1 - Preparation of carboxy poly(vinyl alcohol) from carboxy poly(vinyl acetate).

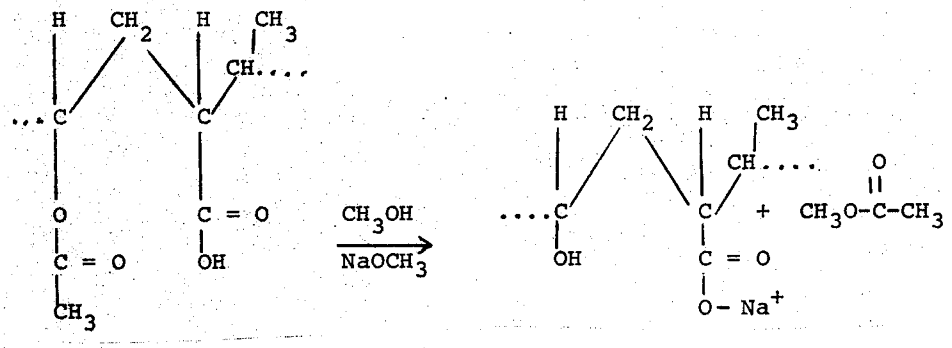

When the carboxylated poly (vinyl alcohol) is condensed with 4-chlorobenzaldehyde and the resulting product is 20 percent by weight of the group labelled A, i.e., 20 percent of the hydroxyls remaining unsubstituted, then assuming for ease of calculation 1000 grams of the carboxylated poly (vinyl alcohol), the mole balance equation is as follows:

$$(907/44) + (93/86) = (0.20W/44) + 2\,(XW/210.5) + (93/86)$$

where $W$ is the weight of the polymer after acetal formation, $X$ is the fraction of the total represented by the group labelled B, and 210.5 is the molecular weight of this group. As will be apparent from the general formula, it is necessary to multiply $XW/210.5$ by 2 because two moles of vinyl alcohol are need to form one mole of acetal. The total weight $W = 0.20\,W + XW + 93$. One can then solve these two simultaneous equations, first for $X$, $X = (0.80W - 93)/W$ and then for $W$ $$907/44 = (0.2W/44) + 2\,(0.80W - 93)/210.5$$

$$W = 1771$$

$$X = 0.80 - (93/1771) = 0.7475$$

To find mole percentages, one simply adds up the number of moles represented by each of the groups labelled A, B and C and then divides to produce the fraction of the whole represented by each:

$$\overset{A}{\frac{0.20\,(1771)}{44}} + \overset{B}{\frac{0.7475\,(1771)}{210.5}} + \overset{C}{\frac{0.0525\,(1771)}{86}}$$

= 15.42

= total number of moles

Materials

| | |
|---|---|
| Crotonic acid-vinyl acetate copolymer, 5% by weight crotonic acid | 50 g |
| Methanol | 500 ml |
| Sodium | 1 g in 20 ml Methanol |

Procedure

The copolymer was dissolved in the methanol and brought to gentle reflux. The sodium methoxide catayIst was added, and reflux continued for 30 minutes. The product precipitated as a fine flake and was filtered and rinsed with methanol. The methanol-wet cake weighed 150 g.

Step 2 - Preparation of carboxy poly(4-chlorobenzal) resin.

Materials

| | |
|---|---|
| Methanol-wet cake of carboxy poly(vinyl alcohol) from Step 1. | 150 g |
| Water | 250 ml |
| 4-chlorobenzaldehyde | 32 g |
| 2-methoxyethanol (Methyl Cellosolve) | 100 ml |
| Sulfuric acid | 5 ml in 20 ml $H_2O$ |

Procedure

The poly(vinyl alcohol cake was dissolved in water and brought to reflux in a well-stirred 1-liter vessel. The diluted sulfuric acid was added, then the 4-chlorobenzaldehyde in methyl cellosolve. Within 15 minutes a large mass of polymer formed. The reaction was continued for 1.5 hours, the liquid phase decanted, and the polymer mass washed with water.

The impure polymer was purified by dissolving it in 500 ml of methyl cellosolve and mixing it with a total of 2 liters of 3 percent sodium bisulfite solution. The product was thoroughly washed with water and air-dried at room temperature The resin had 24 percent residual hydroxyl content.

Acids other than crotonic could be copolymerized with vinyl acetate, such as acrylic, methacrylic or maleic acids. Alternately, a carboxy aldehyde can be employed as a minor component during acetal formation, condensing it with a non-carboxylated poly (vinyl alcohol).

Mixtures of aldehydes can be used during acetal formation, resulting in desirable properties that are contributed by each aldehyde. For instance, 4-chlorobenzaldehyde imparts hardness to the resin even when employed in a ratio of 50:50 with benzaldehyde.

The interchangeability of substitution of chloro, bromo and nitro on the benzene ring in poly (vinyl alcohol) polymer chemistry is well known, as indicated for example by U.S. Pat. No. 3,637,394. Illustrative of benzaldehydes which can be used in place of 4-chlorobenzaldehyde in Step 2 are 2-chlorobenzaldehyde, 3,4-dichlorobenzaldehyde, 4-bromobenzaldehyde and 3-nitrobenzaldehyde.

Because of the properties which they impart to the resin and the simplicity of their use in synthesizing the resin, as well as their low cost and availability, benzaldehydes are preferred for preparation of the acetal. In addition to the 4-chlorobenzaldehyde (and benzaldehyde itself), for example 2-chlorobenzaldehyde, 3,4-dichlorobenzaldehyde, 4-hydroxybenzaldehyde, salicylaldehyde (o-hydroxy benzaldehyde), p-anisaldehyde (p-methoxybenzaldehyde), enzaldehyde), veratraldehyde (3,4-dimethoxybenzaldehyde) and 3-nitrobenzaldehyde can be employed to prepare the benzal resin. Other aromatic aldehydes which may be employed include cinnamaldehyde (phenylacrolein) and 2-naphthaldehyde. In utilizing mixtures of aldehydes during acetal formation, a minor proportion of a heterocyclic or an aliphatic aldehyde may be employed. Illustrative examples of such aldehydes include furfural, furanacrolein, 2,3-dimethyl pentaldehyde, chloral and proprionaldehyde.

The photopolymer of the present invention is insoluble in water but soluble in a wide range of organic solvents. Like the diazo incorporated in it, the photopolymer is negative-working; light causes crosslinking between the diazo and the cyclic acetal and hence insolubilizes the polymer. When utilized in a photolithographic printing plate, the photopolymer is rendered insoluble by exposure to light which passes through the transparent areas of an original or master transparency. In the unexposed portions of the plate, the soluble photopolymer is removed by the application of a suitable solvent for the polymer.

The photopolymer of the present invention, when employed in a photolithographic printing plate, provides an image which is highly resistant to wear and which firmly bonds to a widely-used support for lithographic printing plates, namely aluminum, and particularly anodized aluminum. These properties enable plates of the present invention to produce up to 300,000 copies and also make the plates resistant to over-development, that is, it is difficult to remove the polymer in the exposed areas by excessive rubbing with the developing solution. Furthermore, the exposed polymer is highly receptive to ink, thus making the plate easy to start on the press. The unexposed polymer is readily removed by a great variety of solvents, thus affording considerable latitude in choice of solvent for development of the plate.

Reaction products of the condensation products of para-diazo-diphenylamine and formaldehyde with sodium lauryl sulfate, n-octyl hydrogen sulfate, sodium cyclohexyl sulfate, n-stearyl hydrogen sulfate, and with a large number of aromatic sulfonic acids, including p-toluene sulfonic acid, work satisfactorily in combination with the cyclic acetal resin. The diazo prepared from n-stearyl hydrogen sulfate and Kalle's MN59 is preferred for its faster photographic response. The concentration of diazo material in the resin is not critical, from 5–500 percent by weight of the resin giving excellent results.

Utilizing suitable subbing layers and appropriate selection of resin, the photopolymer composition of the present invention may be applied to a wide variety of substrates such as aluminum, glass, Mylar (polyester), copper, paper, semiconductive silicon, magnesium and stainless steel. Substrate materials preferred for use in making photolithographic plates in accordance with the invention include brush-grained and silicate-treated aluminum and etched, anodized and silicated aluminum. The differences in the characteristics of these various substrates and their preparation for coating in order to achieve an adherent coating are well known in the art and the appropriate manipulation of the substrate and coating composition are deemed to be within the ability of one of ordinary skill in the art to which the present invention pertains. Any suitable coating technique known in the art, such as the use of spinners, curtain coaters, air knife, reverse-roll or fountain coating can be employed to apply the photopolymer composition.

As will be appreciated by one of ordinary skill, the solvent in which the resin is dissolved, and consequently the solvation of the resin, can influence the adherence to the substrate. Thus, as is known in the art, the performance of the resin can be optimized by an appropriate choice of solvent for the resin. Examples of solvents from which such selection may be made include 2-methoxyethanol, 2-ethoxyethanol, methylethylketone, chloroform, isopropanol, n-propanol, butyrolactone, and a 60/40 mixture of toluene and ethanol.

The following preferred embodiments more fully illustrate the present invention.

EXAMPLE 1

To an aqueous solution containing 2–½ percent by weight of paradiazodiphenylamine-formaldehyde condensation product formed from a phosphoric acid medium, (Kalle's MN-59), was added an equal volume of an aqueous solution containing 1 percent by weight of sodium lauryl sulfate (dodecyl sodium sulfate). The precipitate formed as lumps of a yellow crystalline solid which was separated by filtration and washed with water. A 10 percent solution of the precipitate in a mixed solvent of 60 percent toluene and 40 percent isopropanol was prepared.

A solution of a cyclic acetal of the above general formula, carboxy poly(4-chlorobenzal) prepared from a 5 percent crotonic acidpoly(vinyl acetate) as earlier described, is prepared by dissolving the resin in 2-methoxyethanol (Methyl Cellosolve) to provide 10 percent by weight resin.

A photosensitive coating composition was prepared as follows:

| Component | Parts by Weight |
|---|---|
| Resin solution | 10 |
| Diazo solution | 5 |
| Blue pigment | 0.1 |

The blue pigment was DuPont's Monastral Fast Blue, copper phthalocyanine, Pigment Blue 15, Color Index No. 74 160.

The coating composition was applied by means of a No. 10 Meyer bar to a 5 mil sheet of aluminum which had been chemically etched, anodized and silicated. The plate thus formed was imaged with a 7.7 kilovolt-amp carbon arc lamp at a distance of 25 inches for 45 seconds and developed by swabbing with an aqueous solution containing n-propanol and ammonium sulfite to remove the unexposed photopolymer. When mounted on a lithographic press, the plate was able to produce 275,000 copies.

EXAMPLE II

A paper base provided with a hydrophilic coating, such as the kind used for a direct-image lithographic master imaged usually in a typewriter, was coated with the formula of Example 1 and exposed for 45 seconds to a carbon arc. Upon washing with 2-methoxyethanol, unexposed areas were instantly removed and exposed areas were completely insoluble. The plate ran clearly on a conventional lithographic press.

EXAMPLE III

The formula of Example 1 was coated onto a substrate comprising a laminate of paper, aluminum foil and crosslinked poly (vinyl alcohol) as the hydrophilic surface. It was exposed through a half-tone negative for 45 seconds to a carbon arc as previously described. Development was effected by swabbing with the developer of Example 1, but with 10 percent butyrolactone added to make it more active. Bonding of image areas to the substrate was excellent.

EXAMPLE IV

By way of illustration of a manner in which circuit boards may be prepared, a 1-mil layer of copper adhered to a phenolic backing is used as the support for coating a composition as in Example 1. A heat-cured polyvinyl alcohol layer is used as a subbing layer to promote adhesion. Upon exposure and development, areas of copper are exposed, and are removed by etching away with hot 40 percent ferric chloride solution.

EXAMPLE V

The blue pigment of Example 1 is used to make image areas visible as the background is removed during development. It serves admirably for this purpose due to its fine particle size and the fact that its light absorption does not compete with that of the diazo. In other applications, it may be desirable to incorporate pigments of other colors such as white, red, yellow, black, green, for example, in the preparation of metal name-plates and out-of-door signs of outstanding durability and convenience of manufacture. Specific pigments that can be used are Sumatra yellow, C. P. Light yellow, Monarch green and Selkirk red, manufactured by the Hercules Corporation. In some instances, it may be desirable to leave the pigment out altogether, which in no way affects the function of the photopolymer composition.

A piece of plate coated as in Example 1 but with no blue dye, was imaged and developed to a large block-lettered negative. A multi-colored sign was prepared by manually inking by swabbing the lettered regions with different colored lithographic developing emulsions. Monochromatic signs can be made by incorporating a pigment directly into the subtractive coating.

A photopolymer composition has been described which employs a solvent-soluble diazo and an aromatic poly(vinyl acetal). When exposed to light, the material is completely insolubilized, while the unexposed areas remain soluble in a wide variety of solvents. A principal application is in the preparation of subtractive lithographic plates, where the extreme toughness of the exposed material gives a very long run-length to the plate. Exceptional adhesion between the photopolymer layer and the hydrophilic surface of the lithographic plate is provided by the incorporation of carboxyl groups into the basic polymer chain. Applications of this photopolymer composition to uses other than lithography have also been described.

While the invention has been particularly described with reference to preferred embodiments thereof, it is understood that various other changes and modifications thereof will occur to a person skilled in the art without departing from the spirit and scope of the invention as defined by the appended claims.

What is claimed is:

1. A photopolymer composition comprising a mixture of a solvent soluble, negative-working diazo compound and a cyclic acetal of poly (vinyl alcohol) wherein the diazo compound is the product formed by reacting in an aqueous medium an anionic surfactant or salt thereof and the condensation product of a diphenylamine-4-diazonium salt with formaldehyde, the surfactant corresponding to the formula

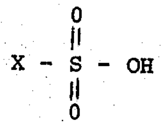

wherein X— is R— or RO— and R is alkyl of more than three carbon atoms, alkyl of more than three carbon atoms interrupted by one or more oxyalkylene groups or alkyl of more than three carbon atoms substituted by phenyl, naphthyl, alkylphenyl, alkylnaphthyl, or alkylphenyl or alkylnaphthyl interrupted by one or more oxyalkylene groups, or X— is Ar— or ArO— wherein Ar is a phenyl or a naphthyl moiety and the resinous cyclic acetal of poly(vinyl alcohol) consists essentially of repeating units of the general formula

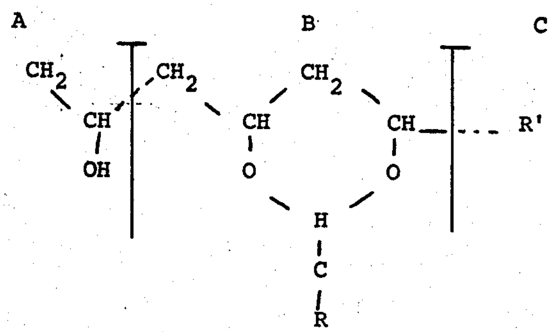

where R is, in more than half of the groups labelled B, an aromatic moiety taken from the group consisting of benzene and naphthalene, R′ is a carboxyl-containing copolymerizable unit derived from an unsaturated mono-or dicarboxylic acid and the polymer consists of 17 to 65 mole percent of the group labelled A, from greater than zero up to 16 mole percent of the group labelled C and the remainder being the group labelled B.

2. The photopolymer composition according to claim 1 wherein the R in the cyclic acetal is a benzene moiety.

3. The photopolymer composition according to claim 2 wherein R is a halogenated or nitrated benzene moiety.

4. The photopolymer composition according to claim 3 wherein R is a 2-chloro-, 4-chloro-, 3,4-dichloro-, 4-bromo-, or 3-nitrobenzene moiety.

5. The photopolymer composition according to claim 1 wherein R′ in the cyclic acetal is a unit derived from an unsaturated mono-carboxylic acid.

6. The photopolymer composition according to claim 5 wherein R′ is a unit derived from acrylic, crotonic, or methacrylic acid.

7. The photopolymer composition according to claim 4 wherein R is a 4-chlorobenzene moiety and R′ is a unit derived from crotonic acid.

8. The photopolymer composition according to claim 1 wherein R′ in the cyclic acetal is a unit derived from an unsaturated dicarboxylic acid.

9. The photopolymer composition according to claim 8 wherein R′ is a unit derived from itaconic or maleic acid.

10. The photopolymer composition according to claim 1 wherein the diazo compound is formed from a surfactant taken from the group of alkyl sulfates having the general formula $ROSO_3H$.

11. The photopolymer composition according to claim 10 wherein R is n-butyl, amyl, hexyl, cyclohexyl, octyl, lauryl, oleyl or stearyl.

12. The photopolymer composition according to claim 1 wherein X— is RAr— or RArO— wherein Ar is phenyl R is alkyl of more than three carbon atoms or cycloalkyl and when Ar is naphthyl R is alkyl of more than two carbon atoms or cycloalkyl.

13. A photosensitive lithographic printing plate comprising a substrate, and overlying the substrate, a layer of the composition according to claim 1.

14. A photosensitive lithographic printing plate comprising a substrate, and overlying the substrate, a layer of the composition according to claim 3.

15. A photosensitive lithographic printing plate comprising a substrate, and overlying the substrate, a layer of the composition according to claim 10.

* * * * *